United States Patent

[11] 3,631,299

[72] Inventors Charles F. Meyer
Wauwatosa;
Clarence N. Groth, Mequon; Kenneth L.
Paape, Mequon, all of Wis.
[21] Appl. No. 39,485
[22] Filed May 21, 1970
[45] Patented Dec. 28, 1971
[73] Assignee Square D Company
Park Ridge, Ill.

[54] PRINTED CIRCUIT BOARD MODULE AND SUPPORT WITH CIRCUIT BOARD SUPPORTING POSTS
12 Claims, 5 Drawing Figs.

[52] U.S. Cl. .......... 317/120, 317/101 DH
[51] Int. Cl. .......... H05k 5/02, H02b 1/10
[50] Field of Search .......... 317/99, 101 CB, 101 CW, 101 DH, 117, 120

[56] References Cited
UNITED STATES PATENTS
3,333,156 7/1967 Weisman .......... 317/101 DH
3,447,036 5/1969 Dore .......... 317/99
3,566,190 2/1971 Huebner .......... 317/100
FOREIGN PATENTS
1,147,280 4/1963 Germany .......... 317/101 DH

*Primary Examiner*—Lewis H. Myers
*Assistant Examiner*—Gerald P. Tolin
*Attorneys*—Harold J. Rathbun and William H. Schmeling

ABSTRACT: A printed circuit board module including a housing which is formed by two substantially identical molded parts that are secured to each other to provide an enclosure for one or two printed circuit boards. The two molded parts each have female- and male-type posts extending through openings in the printed circuit boards. The posts are arranged so the male posts on the respective parts telescope into the female posts to position the printed circuit boards within the interior of a housing provided by the two parts. The housing positions one of the printed circuit boards so portions of the board may be plugged into a female receptacle and includes means for guiding the housing relative to the receptacle.

*INVENTOR.*
CHARLES F. MEYER
CLARENCE N. GROTH
KENNETH L. PAAPE
BY
William H. Schneling INVENTOR.
CHARLES F. MEYER
CLARENCE N. GROTH
KENNETH L. PAAPE
BY
William F. Schmeling

PRINTED CIRCUIT BOARD MODULE AND SUPPORT WITH CIRCUIT BOARD SUPPORTING POSTS

This invention relates to the packaging of solid-state type electronic components and is more particularly concerned with a printed circuit board module construction that is particularly suited for use in industrial-type applications requiring solid-state control.

Solid-state control systems packaged in accordance with the concepts disclosed in U.S. Pat. No. 3,065,385 which was granted to Robert C. Mierendorf on Nov. 20, 1962, have enjoyed acceptance in the market place because of their versatility, reliability and their rugged construction. The versatility of the control systems using solid-state modules disclosed in the Mierendorf patent is achieved through the use of taper-pin type connectors which interconnect the solid state logic circuits packaged within the modules. The taper-pin type connectors assure the reliability of operation of the control system. However, the taper-pin connectors require that the connections between the logic circuits be accomplished manually. Thus, while the control system according to Mierendorf is very versatile and particularly suited for individually wired control systems, when controls are to be mass-produced, the system becomes noncompetitive because of the cost required to manually wire the control system.

Another type of construction, particularly found in computator-type installations, uses printed circuit boards that are positioned by racks and plugged into sockets to establish the electrical circuits between the solid-state components on the boards and the circuits connected to the sockets. While this type of construction has been accepted for use in controlled environments, it is not particularly adapted for use in industrial-type applications in that the printed circuit boards may become loose in the racks wherein they are installed or become subject to warpage, breakage and the like because of vibrations or rough handling.

The solid-state printed circuit board module according to the present invention, when used in a control system in an industrial environment, will overcome certain of objectionable features of systems heretofore known in that the use of the printed circuit board modules in the manner disclosed will permit replacement of modules without disturbing the system wiring, the interwiring between the modules to have a neat appearance, the solid-state components within the modules to be protected from the adverse effects of humidity and other atmospheric contaminants and will locate the indicating lamps and test points for the system so they are readily visible and available. Further, the plug-in module concept will permit the system to be wired with manual or automated wiring techniques and permit system changes to be manually made should modification of the system be required.

It is an object of the present invention to provide a printed circuit board module for a solid-state control system that includes two substantially identical molded insulating parts which are secured together to form an enclosure and a support for a printed circuit board.

Another object is to provide a printed circuit board module for a solid-state control system that includes two substantially identical molded insulating parts which are secured together to provide an enclosure and a support for a printed circuit board and a support for indicating lamps, adjustable resistors and the like which will indicate and control the operation of circuit components on the board when the printed circuit board is plugged into a female receptacle.

A further object is to provide a printed circuit board module that includes a housing for one or two printed circuit boards and to form the housing from two substantially identical molded insulating parts with each part having both at least one female post and one male-type post that cooperate with the male and female posts of the other part to position one or two printed circuit boards with the interior of the housing so a portion of one of the printed circuit boards that extends externally of the housing may be plugged into a female receptacle.

An additional object is to provide a housing for one or two printed circuit boards and to form the housing from two substantially identical molded insulating parts that are mated to each other to form the housing and to provide each of the housing parts with a male post and a female post that are located so the posts extend across the interior of the housing when the male posts are inserted into portion of the female posts of the respective housing parts and the parts are secured together by screws and to provide at least one of the printed circuit boards with openings which receive the posts so as to position the board within the housing and a portion that is exposed externally of the housing so the exposed portion, which has electrical connectors carried thereon, may be received in female connectors that are carried by a support so the module may be installed through a plug-in type connection on the support.

Further objects and features of the invention will be readily apparent to those skilled in the art from the specification and appended drawing illustrating certain preferred embodiments in which.

Figure 1:
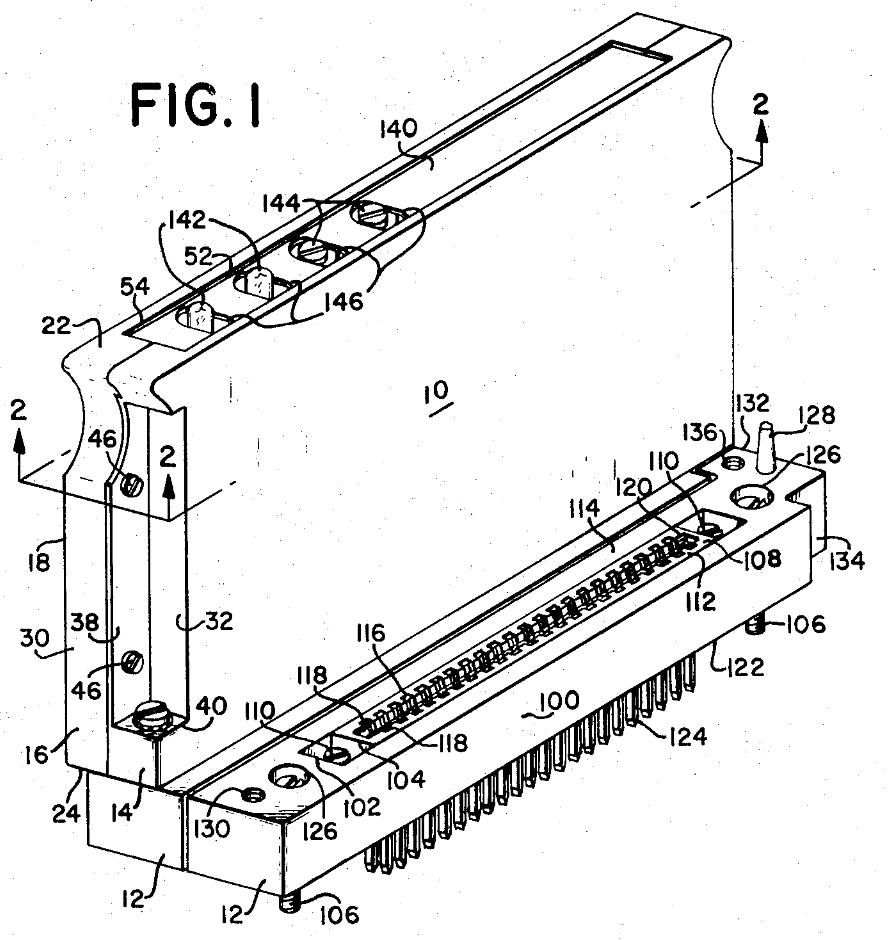
FIG. 1 is a perspective view of a printed circuit board module according to the present invention as mounted on one of a pair of supports.

In the drawings, a printed circuit board module 10 is shown as mounted on one of two supports 12. The module 10 includes a pair of mated parts or halves 14 and 16 that are formed of a molded insulating material and secured to each other to provide a housing 18. The parts 14 and 16 are substantially identical and each includes a substantially rectangularly shaped flat wall 20 that has a font edge 22, a rear edge 24 and a pair of sidewalls 30 and 32. The walls 30 and 32 respectively have surfaces 34 and 36 extending in a common plane that is equidistant and parallel to the walls 20 on the parts 14 and 16 when the parts 14 and 16 are mated to provide the housing 18. The sidewall 32 includes an external indentation which provides a flange 38 and a footlike portion 40 that is forwardly spaced of the rear edge 24. The sidewall 30 includes material to provide two bores 42 and the flange 38 includes two openings 44. The openings 44 are aligned with the bores 42 when the parts 14 and 16 are mated together and permit the parts 14 and 16 to be secured to each other by self-tapping type screws 46 that extend through the openings 44 and are threaded into the bores 42 so the headed portions of the screws 46 engage the material of the flanges 38 when the screws 46 are tightened in the bores 42 to secure the parts 14 and 16 together. If desired, the surface 36 may be provided with a rib 48 and the surface 34 with a groove 50 which receives the rib 48 to aid in aligning the parts 14 and 16 when the parts 14 and 16 are secured to each other.

Extending along the front edge 22 between the walls 30 and 32 is a rib 52 that is sized so an opening 54 is provided between the front ends of the parts 14 and 16 when the parts 14 and 16 are secured together. Extending spaced and parallel to the rib 52 at the top end of the wall 20 is a rib 56. The ribs 52 and 56 are spaced from each other to provide a groove 58 therebetween.

Figure 4:
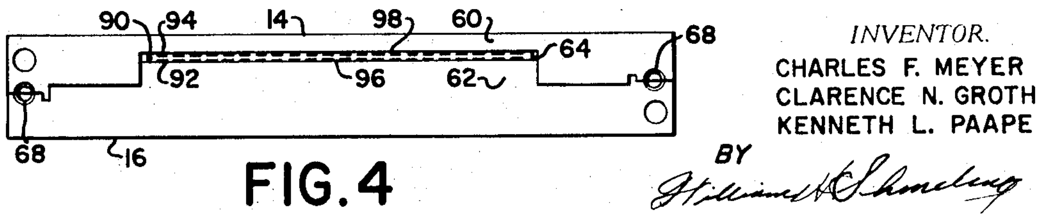
FIG. 4 is a rear end view of the module in FIG. 1, detached from a support.
Figure 5:
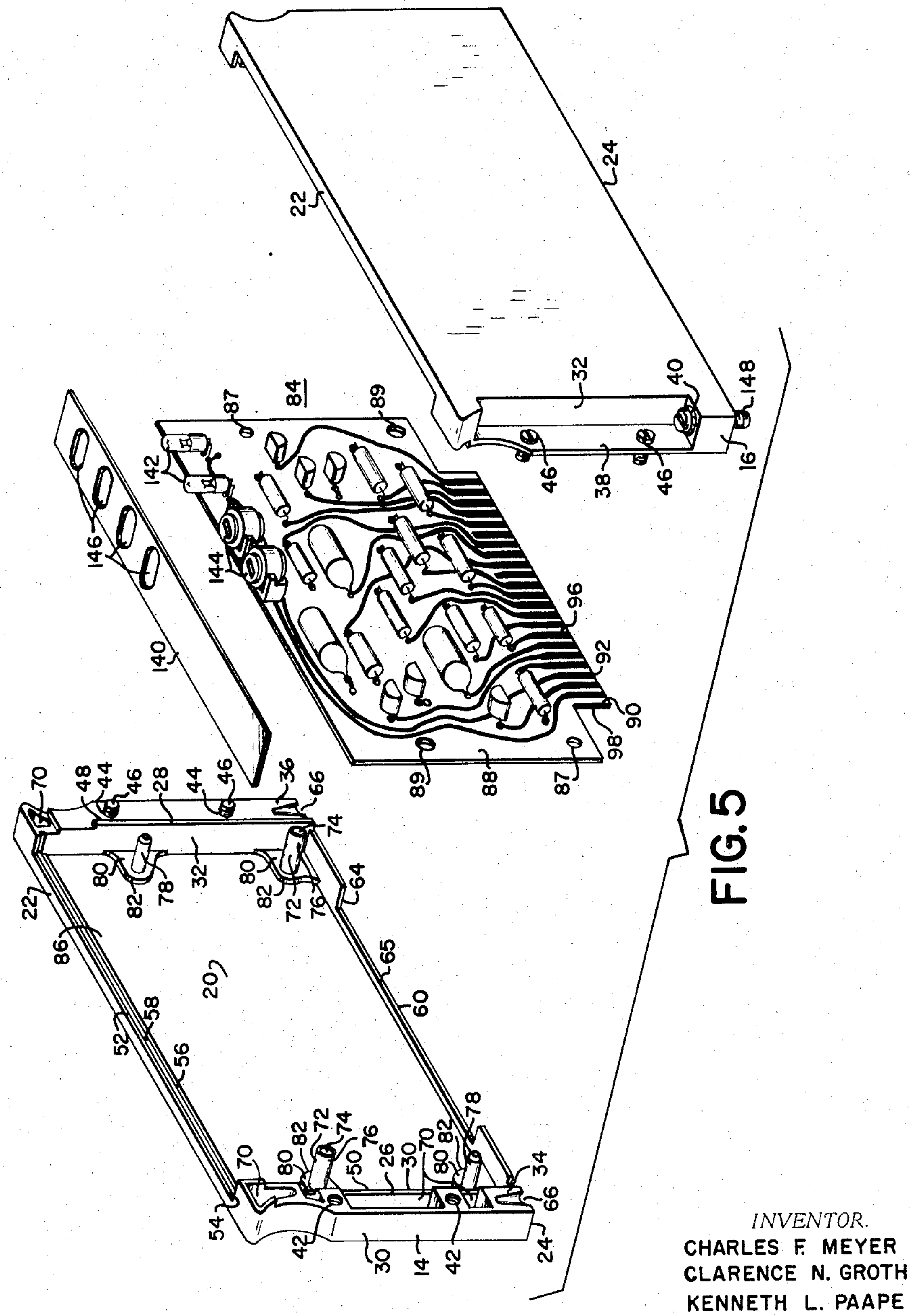
FIG. 5 is an exploded view showing in perspective the components of the printed circuit board module.

If desired, as shown in FIG. 4, the parts 14 and 16 may be provided with suitable wall portions extending along the rear edges of the parts 14 and 16 to provide an opening 64 that is formed between the mated parts 14 and 16 when the parts 14 and 16 are secured to each other. As shown in FIG. 4, the part 14 has a wall portion 60 extending along its rear edge 24. Similarly, the part 16 has a wall 62 extending along its rear edge 24. The walls 60 and 62, when included on the parts, are not required to be identical and the wall 60 is arranged so the opening 64 is displaced from the plane of abutment of the surfaces 34 and 36 and extends along the rear surface of the part 14 in close proximity to the flat wall 20 of the part 14. In contrast, the wall 62 extends on the part 16 beyond the plane of the surfaces 34 and 36 so that the opening 64 is slitlike in shape. Also extending forwardly from the rear edge 24 in the material forming the walls 30 of each of the parts 14 and 16 is a tapered depression 66 which forms a tapered bore 68 when the parts 14 and 16 are secured together.

The openings, indicated by a numeral 70, are included merely to reduce the cross sections of the parts 14 and 16 in the areas wherein the openings 70 are located. The openings thus facilitate the molding and curing of the parts 14 and 16 in accordance with known molding practices.

Each of the molded parts 14 and 16 has four posts extending from the wall 20 in the vicinity of its corners. Two of the posts 72 at the diagonally opposite corners have a bore 74 extending perpendicular to the wall 20 from a free end 76 of the posts 72. The remaining two posts 78 at the remaining two diagonal corners have a diameter smaller than the posts 72 and are sized so that the posts 78 will have a telescopic fit into the bores 74 in the larger diameter posts 72. For purposes of description, the posts 72 are designated as female-type posts and the posts 78 as male-type posts. Each of the posts 72 and 78 extends from a surface 80 of a ledge 82. The ledges 82 extend from the wall 20 so the surfaces 80 are spaced from the wall 20 and extend in a common plane that is coplanar with an edge 65 on the wall 60. The malelike posts 78 have a length less than the depth of the bores 74 and the female posts 72 extend so that the free ends 76 thereon are spaced a distance that is substantially equal to the thickness of a printed circuit board 84 from the surface 80 carrying the male post 78 which is received by the female posts 72.

A printed circuit board 84, which is received within an interior 86 of the housing 18, includes a body portion 88. The body portion 88 has a width which will permit it to be received between the walls 30 and 32 and a depth which will permit it to be positioned between the wall 60 and the rib 56. The board 84 has a thickness which will permit it to be received between the free ends 76 and the surface 80 from which the posts 78 extend when the board 84 is positioned within the interior 86. Additionally, the board 84 has a projection 90 extending from the body portion 88. The projection 90 extends through the slitlike opening 64 to the exterior of the housing 18 and carries a plurality of spaced bladelike conductive fingers 92 and 94 which are respectively spaced in rows along the rear edge of the projection 90 on opposite faces 96 and 98 of the projection 90. The fingers 92 and 94 are respectively connected to printed circuits on the faces 96 and 98 of the printed circuit board 84. The face 96 in addition to the printed circuits carries suitable electrical components which are positioned on the face 96 and connected to the printed circuits on the faces 96 and 98. The components on the face 96 may include resistors, capacitors, transistors, diodes and silicon controlled rectifiers, all of which are conventionally frequently mounted on printed circuit boards and are well known to those skilled in the art. The face 98 does not include electrical components, so that it may be positioned in close proximity to the wall 20. The body portion 88 is provided with four holes 87 and 89 that are respectively complementary in size and location to the male and female posts 78 and 72. The holes 87 receiving the male posts 78 are sized so that when the board 84 is positioned on the posts 72 and 78, the material of the board 84 surrounding the male post 78 will be positioned between the free end 76 and the surface 80 to maintain the face 98 adjacent the wall 20 and the board 84 against movement in the interior 86.

Each of the supports 12 is formed of a suitable molded insulating material to provide a generally rectangularly shaped part 100. The part 100 has an elongate rectangular opening 102 extending therethrough which receives a terminal assembly 104. The part 100 includes a pair of suitable bores located on opposite ends of the opening 102 which receive a pair of screws 106 that may be threaded into suitable openings in a support, not shown, to secure the support 12 on a vertical panel. When the part 100 is mounted on a support panel, the entire part 100 will be exposed to the front of the panel and the panel will be provided with a suitable opening or space which may be partly or completely closed by the supports 12 when one or more supports 12 are mounted in a row and will expose the rear end of the terminal assembly 104 to the rear of the panel.

The terminal assembly 104, which per se does not form a part of the present invention with the exception of the combination wherein it is used, includes a molded rectangularly shaped body 108 having ears extending from its opposite ends which provide a passage for suitable screws 110 that are threaded into ledges at the end of the opening 102 to mount the terminal assembly in the opening 102 with a front surface 112 of the body 108 extending flush with the front surface 114 of the part 100. Extending lengthwise in the front surface 112 is an elongated socket 116 which has spaced teethlike projections extending from its opposite sides that are disposed in pairs on opposite sides of the socket 116 to provide a plurality of niches that are disposed in pairs and spaced from each other along the opposite walls of the socket 116. Positioned in each of the niches is a bladelike member 118. The bladelike members 118 in the niches in the opposite walls provide a row of spaced pairs of bladelike members with the bladelike members 118 of each pair disposed on opposite sides of a central passage 120 so that when the projection 90 is inserted into the passage 120 the fingers 92 and 94 will engage the bladelike members 118 and form an electrical connection therebetween. Extending from a rear surface 122 of the body 108 are a plurality of metal terminals 124 each of which is connected to one of the bladelike members 118. The terminals 124 are provided so that wires may be electrically secured thereto in any one of several well-known methods which may be accomplished either manually or with the use of automatic machinery or tools so that the wiring may be accomplished from the rear surface 122 side of the support 12. Thus when the support 12 is wired, the wires connected to the terminals 124 will be concealed from the front of the panels by the support 12.

The part 100 includes a pair of bores receiving the screws 106. The part 100 also includes an opening at its upper end having a tapered pin 128 anchored therein. An opening at the lower end of the part 100 has a threaded insert 130 embedded therein. Extending from an upper left sidewall of the molded part 100 is a projection 132 and extending inwardly at the upper right of the part 100 is a depression 134. The depressions 134 in the part 100 receive the projections 132 of an adjacent support 12, when the supports 12 are mounted adjacent to each other in a row on a panel. Embedded in an opening in the projection 132 is a threaded insert 136.

The module 10, if required, may also be provided with an arrangement including a member 140 which will expose indicating lamps 142 and provide access to potentiometer-type resistors 144 and test points which are located in the interior 86. The member 140 is formed of a relatively stiff sheet of insulating material which is received and held in the grooves 58 in parts 14 and 16 to close the opening 54 at the front end of the module 10. The member 140 has openings 146 therein which will expose the indicating lamps 142 that conventionally are mounted on the forward edge of the printed circuit board 84 within the interior 86. The indicating lamps 142 are connected to portions of the printed circuits on the board 84 to indicate the operative state of the circuits within the module. The openings 146 also provide access to the test points and/or adjustment portions of the potentiometer resistors 144 from the front end of the module 10. Thus the indicating lamps 142, test points, and the potentiometers 144 will be easily visible and accessible when the module 10 and support 12 are mounted on a panel.

Figure 2:
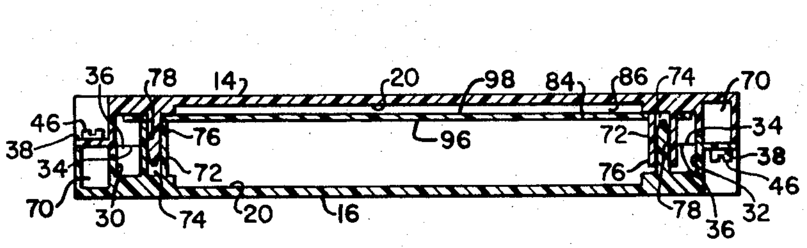
FIGS. 2 and 3 are cross-sectional views of a printed circuit board module taken along line 2—2 in FIG. 1, respectively illustrating the module with a single-printed circuit board and two printed circuit boards mounted therein.

The assembly of the module 10 may be accomplished by positioning the printed circuit board 84 on one of the parts of the housing 18. For example, if the printed circuit board 84 is positioned on the part 14, the openings 87 and 89 in the printed circuit board will respectively receive the male posts 78 and the female posts 72 on the part 14 while the printed circuit board rests on the surfaces 80 and the projection 90 extends through the opening 64. The member 140 is positioned in the groove 58 so as to close the opening 54 in the housing 18 when the parts 14 and 16 are assembled. The part 16 is then mated with the part 14 by orienting the part 16 so that it faces in the opposite direction from the part 14 and thus will permit the male posts 78 on the respective parts 14 and 16 to be received within the female posts 72 on the parts 14 and 16. In this connection, while the parts 14 and 16 are shown as having two male posts and two female posts, it is obvious that the parts may include more or less than the indicated number of posts, providing the male and female posts are located so that they will cooperate with each other in the manner described to position the printed circuit board 84 within the interior 86 of the housing 18. When the parts 14 and 16 are thus positioned, the member 140 will be received in the groove 58 in part 16 and the openings in the flanges 38 on the respective parts 14 and 16 will be aligned with the bores 42 so that the screws 46 may be used to secure the parts 14 and 16 together. In this connection it is to be noted that the pairs of screws 46 on the opposite sides of the part of the housing 18 will face in opposite directions, as illustrated in FIGS. 2 and 3.

Figure 3:
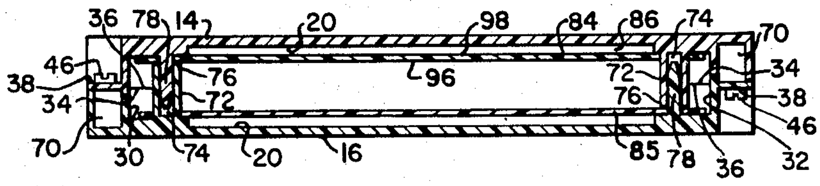

In FIG. 3 of the drawings, the module is shown as including a pair of printed circuit boards 84. When a pair of printed circuit boards 84 and 85 are included within the module 10, only one of the pair of boards will be provided with a portion analogous to the projection 90. The remaining board will not include a projection 90 and will be entirely enclosed within the interior 86. When a pair of printed circuit boards are used, the board 84 including the projection 90 will be positioned on the surfaces 80 of the part 14 by the male and female posts in a manner previously described. The remaining board 85 which does not have a projection 90 will also be positioned on surfaces 80 of the housing part 16 by the male and female posts 78 and 72. The pair of printed circuit boards 84 and 85 within the interior 86 will be oriented so that the electrical components on the faces 96 will be located between the spaced boards 84 and 85 while the faces 98 of the printed circuit boards 84 and 85 that include only the printed circuits and do not include electrical components will be positioned adjacent the walls 20 on the respective parts 14 and 16. The interconnection between the pair of printed circuit boards on both boards 84 and 85 is accomplished by suitable conductors, not shown, which are electrically connected in circuit with the fingers 92 and 94 that are carried by the projection 90 on the board 84.

The modules 10 are positioned on the supports as follows. As previously described, the supports 12 are mounted on a panel before the modules 10 are applied thereto. This is accomplished by securing the supports 12 to the panel by means of the screws 106 so that the terminals 124 on the supports 12 are exposed at the rear of the panel. This will permit the terminals 124 to have wires connected thereto in a manner well known to those skilled in the art. The module 10 is installed in position on the support 12 by orienting the module 10 so that the projection 90 is aligned with the passage 120 and the tapered pin 128 is received in the tapered bore 68 at the upper end of the module 10. The tapered pin 128 and the tapered bore 68 serve to guide the module 10 into its final position when a manual force is applied to the forward end of the module 10 to force the fingers 92 and 94 between the bladelike connectors 118 and to establish an electrical circuit therebetween. The module 10 is secured on the support 12 against movement when screws 148 extending through bores in the feet 40 are tightened into the inserts 130 and 136 to maintain the module 10 from displacement from the support 12 in the event the panel whereon the assembly is mounted should be subjected to vibration and the like. When it is desired to remove the modules 10 from the supports 12, which may be required in the event of a component failure within the modules or the modification of the logic in the circuits wherein the module is included, all that is required is that the screws 148 be loosened and the module 10 be pulled to release its plug-in type connection between the fingers 92 and 94 and the bladelike members 118. In the event that the circuit components on the printed circuit board 84 or the board 85 require inspection or service, all that is required to obtain access thereto is to loosen the screws 46 so that the housing parts 14 and 16 may be separated from each other to expose the electrical components which are mounted on the printed circuit boards.

For convenience in description, the module 10 and the support 12 have been described in a manner in which they will appear when mounted on a vertical panel when the support 12 is secured to the panel to close an opening in the panel which permits access to the terminals on the support 12. The module has been described in accordance with its position when mounted on the vertical support when the guide pin 128 is at the upper end of the support 12. Hence the terms "forward," "rear" and "side" are merely relative, as the combination including the module 10 and the support 12 will be operative when oriented in other positions.

While certain preferred embodiments of the invention have been specifically disclosed, it is understood that the invention is not limited thereto, as many variations will be readily apparent to those skilled in the art and the invention is to be given its broadest possible interpretation within the terms of the following claims.

What is claimed is:

1. A printed circuit module comprising: two substantially identical molded insulating mated parts, each of the two parts including a flat wall presenting a pair of side edges and an end, a sidewall extending in the same direction from each of the side edges on each part to present a pair of surfaces that are spaced from the flat wall, at least one male post and at least one female post extending in the said same direction from the flat wall on each part and located equidistantly on opposite sides of a central axis of the flat wall, means maintaining the pair of surfaces on a first one of the two parts in abutting engagement respectively with the pair of surfaces on the second of the two parts for mating the parts to each other so that the two mated parts provide a housing that has an interior extending between the walls of the mated parts and an opening that extends into the interior from the ends of the two mated parts, said posts on the mated parts having a shape, size and location on said parts so that the male posts on the two parts are received in bores that extend from free ends in the female posts and the end of each female post is spaced a predetermined distance from the wall of the part carrying the male post which is received by the female post, and a printed circuit board having a body portion within the interior of the housing, a projection extending from the body portion through the opening between the mated parts, said printed circuit board having openings located on opposite sides of a plane through the axis of the mated parts receiving the male posts on the parts and providing a portion on the printed circuit board that surrounds the opening receiving the male post that is engaged by the free end on the female post and positioning the printed circuit board adjacent the flat wall of one of the two mated parts.

2. The printed circuit module as recited in claim 1 wherein each of the molded parts includes a pair of malelike posts and a pair of femalelike posts and the printed circuit board includes a pair of openings which receive the malelike posts and a pair of openings which receive the femalelike posts.

3. The printed circuit module as recited in claim 1 wherein the body portion of the printed circuit board provides a support for a plurality of electronic components and the projection provides a support for electrical connectors that are connected through circuits to the electronic components.

4. The printed circuit module as recited in claim 3 wherein the molded mated parts provide a second opening in an end of the housing that is opposite the opening through which the projection on the printed circuit board extends and a member having openings exposing indicating lamps positioned within the interior closing the second opening.

5. The printed circuit module as recited in claim 3 wherein the molded mated parts provide a second opening in an end of the housing that is opposite the opening through which the projection on the printed circuit board extends and a member providing access to a plurality of potentiometer-type resistors positioned within the interior closing the second opening.

6. The combination of the printed circuit module as recited in claim 3 including a molded support, a plurality of female electrical connectors positioned by the molded support and receiving the electrical connectors on the printed circuit board and including a projection on the molded support and a guide opening in at least one of the molded parts which receives the projection on the molded support for positioning the module on the support.

7. The structure as recited in claim 6 wherein the printed circuit module is positioned on one side of the support and the female connectors have portions extending from the side of the support opposite the said one side of the support which provide terminal connectors for the electric components on the printed circuit board within the printed circuit module.

8. The printed circuit module as recited in claim 1 wherein the means for maintaining the abutting engagement between the surfaces on the two parts includes two pairs of screws with one of the pair of screws having headed portions positioned adjacent one of the pair of mated parts and the other of the pair of screws having head portions adjacent the other of the pair of mated parts.

9. The printed circuit module as recited in claim 1 that includes a pair of printed circuit boards with each of the pair of printed circuit boards having openings therein receiving the malelike and the femalelike posts so the one of the printed circuit boards is positioned adjacent the flat wall of one of the pair of mated parts and the other of the pair of printed circuit boards is positioned adjacent the flat wall of the other of the pair of mated parts.

10. The printed circuit module as recited in claim 9 wherein both printed circuit boards have electrical components mounted on one face of each board and only one of the pair of boards has a projection extending through the opening carrying electrical connectors that are electrically connected to the electrical components on both boards.

11. The printed circuit module as recited in claim 10 wherein the molded mated parts provide a second opening in an end of the housing that is opposite the opening through which the projection on the printed circuit board extends and a member having openings exposing indicating lamps positioned within the interior closing the second opening.

12. The printed circuit module as recited in claim 9 wherein the means for maintaining the abutting engagement between the surfaces on the two parts includes two pairs of screws with one of the pair of screws having headed portions positioned adjacent one of the pair of mated parts and the other of the pair of screws having head portions adjacent the other of the pair of mated parts.

* * * * *